United States Patent
Honda

(10) Patent No.: US 6,938,193 B1
(45) Date of Patent: Aug. 30, 2005

(54) ECC CIRCUIT-CONTAINING SEMICONDUCTOR MEMORY DEVICE AND METHOD OF TESTING THE SAME

(75) Inventor: Toshiyuki Honda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 328 days.

(21) Appl. No.: 09/613,631

(22) Filed: Jul. 11, 2000

(30) Foreign Application Priority Data

Jul. 12, 1999 (JP) .......................................... 11-196903

(51) Int. Cl.[7] ............................................. G11C 29/00
(52) U.S. Cl. ..................... 714/720; 714/766; 714/764
(58) Field of Search .................. 714/720, 718, 714/738, 764, 766, 785, 800, 801, 807

(56) References Cited

U.S. PATENT DOCUMENTS

| | | | |
|---|---|---|---|
| 4,335,459 A | * | 6/1982 | Miller ......................... 714/755 |
| 4,394,763 A | | 7/1983 | Nagano et al. ............... 371/38 |
| 4,561,095 A | | 12/1985 | Khan |
| 4,730,320 A | | 3/1988 | Hidaka et al. |
| 4,903,268 A | * | 2/1990 | Hidaka et al. ............... 714/766 |
| 5,233,610 A | * | 8/1993 | Nakayama et al. ......... 714/704 |
| 5,463,643 A | * | 10/1995 | Gaskins et al. ............. 714/766 |
| 5,487,077 A | * | 1/1996 | Hassner et al. ............. 714/762 |
| 5,502,732 A | | 3/1996 | Arroyo et al. |
| 6,295,617 B1 | | 9/2001 | Sonobe |

FOREIGN PATENT DOCUMENTS

| | | |
|---|---|---|
| DE | 198-29-234 A1 | 1/1999 |
| EP | 0 346 629 A | 5/1989 |
| EP | 0 327 309 A | 8/1989 |
| EP | 0-327-309 A2 | 8/1989 |
| EP | 0-346-629 A2 | 12/1989 |
| JP | 5-54697 | 3/1993 |
| WO | WO8000626 | 4/1980 |

OTHER PUBLICATIONS

Notice of Rejection Reasons, "ECC Circuit–Containing Semiconductor Memory Device and Method of Testing the Same" Issued Apr. 24, 2002.

* cited by examiner

Primary Examiner—Christine T. Tu
(74) Attorney, Agent, or Firm—Nixon Peabody LLP; Donald R. Studebaker

(57) ABSTRACT

In an ECC circuit of an ECC circuit-containing semiconductor memory device, an error correcting code/syndrome generating circuit and a data correcting circuit are disposed. In portions of the ECC circuit connected to buses, a data bus input control circuit for controlling input of a data from a data bus; an error correcting code bus input control circuit for controlling input of an error correcting code from an error correcting code bus; and an error correcting code bus output control circuit for controlling output of an error correcting code to the error correcting code bus are disposed. A portion corresponding to an error correcting code generator of a conventional technique is included in the ECC circuit, so that the ECC circuit can function both as an error correcting code generator and a decoder. As a result, the entire device can be made compact.

9 Claims, 12 Drawing Sheets

Fig. 5

| | X=255 | X=254 | ... | X=9 | X=8 | X=7 | X=6 | X=5 | X=4 | X=3 | X=2 | X=1 | X=0 | |
|---|---|---|---|---|---|---|---|---|---|---|---|---|---|---|
| Y=0 | 10101010 | 01010101 | ••••• | 10101010 | 01010101 | 10101010 | 01010101 | 10101010 | 01010101 | 10101010 | 01010101 | 10101010 | 01010101 | |
| Y=0 | 1010 | 0101 | ••••• | 1010 | 0101 | 1010 | 0101 | 1010 | 0101 | 1010 | 0101 | 1010 | 0101 | |
| Y=1 | 10101010 | 01010101 | ••••• | 10101010 | 01010101 | 10101010 | 01010101 | 10101010 | 01010101 | 10101010 | 01010101 | 10101010 | 01010101 | |
| Y=1 | 1010 | 0101 | ••••• | 1010 | 0101 | 1010 | 0101 | 1010 | 0101 | 1010 | 0101 | 1010 | 0101 | |
| Y=2 | 10101010 | 01010101 | ••••• | 10101010 | 01010101 | 10101010 | 01010101 | 10101010 | 01010101 | 10101010 | 01010101 | 10101010 | 01010101 | |
| Y=2 | 1010 | 0101 | ••••• | 1010 | 0101 | 1010 | 0101 | 1010 | 0101 | 1010 | 0101 | 1010 | 0101 | |
| Y=3 | 10101010 | 01010101 | ••••• | 10101010 | 01010101 | 10101010 | 01010101 | 10101010 | 01010101 | 10101010 | 01010101 | 10101010 | 01010101 | |
| Y=3 | 1010 | 0101 | ••••• | 1010 | 0101 | 1010 | 0101 | 1010 | 0101 | 1010 | 0101 | 1010 | 0101 | |

Fig. 9

| Error bit | Syndrome | | | |
|---|---|---|---|---|
| | S0 | S1 | S2 | S3 |
| 1 0 0 0 0 0 0 0 | 1 | 0 | 1 | 1 |
| 0 1 0 0 0 0 0 0 | 1 | 1 | 0 | 1 |
| 0 0 1 0 0 0 0 0 | 1 | 1 | 1 | 0 |
| 0 0 0 1 0 0 0 0 | 0 | 1 | 1 | 1 |
| 0 0 0 0 1 0 0 0 | 0 | 1 | 1 | 0 |
| 0 0 0 0 0 1 0 0 | 1 | 1 | 0 | 0 |
| 0 0 0 0 0 0 1 0 | 1 | 0 | 0 | 1 |
| 0 0 0 0 0 0 0 1 | 0 | 0 | 1 | 1 |

Fig. 12

| Error bit | Syndrome | | | |
|---|---|---|---|---|
| | S0 | S1 | S2 | S3 |
| 1 0 0 0 0 0 0 0 | 1 | 1 | 0 | 0 |
| 0 1 0 0 0 0 0 0 | 1 | 0 | 1 | 0 |
| 0 0 1 0 0 0 0 0 | 0 | 1 | 1 | 0 |
| 0 0 0 1 0 0 0 0 | 1 | 1 | 1 | 0 |
| 0 0 0 0 1 0 0 0 | 1 | 0 | 0 | 1 |
| 0 0 0 0 0 1 0 0 | 0 | 1 | 0 | 1 |
| 0 0 0 0 0 0 1 0 | 1 | 1 | 0 | 1 |
| 0 0 0 0 0 0 0 1 | 0 | 0 | 1 | 1 |

ECC CIRCUIT-CONTAINING SEMICONDUCTOR MEMORY DEVICE AND METHOD OF TESTING THE SAME

BACKGROUND OF THE INVENTION

The present invention relates to a semiconductor memory device containing an error correcting code circuit (ECC circuit).

In accordance with recent increase in the storage capacity of a semiconductor memory device, the probability of failure occurring in any of memory elements included in the semiconductor memory device or the probability of error write and error read has been increased. Therefore, an ECC circuit-containing semiconductor memory device having a function to detect a data error from an electric signal and correct the detected error has been proposed.

An ECC circuit has an error correcting function designed on the basis of a coding theory. An error is corrected through encoding as follows: Information to be originally transferred is sent with redundancy added in accordance with a given rule, and a receiver checks whether or not the received information accords with the rule, so as to detect and correct an error in accordance with the result of the check. Therefore, in an ECC circuit-containing semiconductor memory device, in order to improve its reliability, redundancy is added to digital information so as to be processed more easily and systematically with a machine.

As an example of the conventional technique, an ECC circuit-containing semiconductor memory device and its operation disclosed in Japanese Laid-Open Patent Publication No. 5-54697 will now be described with reference to FIGS. 10 and 11.

FIG. 10 is a block diagram for schematically showing the structure of the conventional ECC circuit-containing semiconductor memory device (hereinafter referred to as the first conventional example) described in the publication and corresponding to the background of this invention. As is shown in FIG. 10, an ECC circuit memory block 101 includes a data storage area 102, an error correcting code storage area 103, an error correcting code generator 104, a decoder 105 and an I/O control circuit 106.

The I/O control circuit 106 sends a data input through an I/O data line 112 from a device externally provided to the ECC circuit memory block 101 to the data storage area 102 and the error correcting code generator 104 through an input data line 107. The error correcting code generator 104 receives the input data from the input data line 107, generates an error correcting code corresponding to the input data, and inputs the generated error correcting code to the error correcting code storage area 103 through an error correcting code line 108. The decoder 105 fetches a data read from the data storage area 102 through a read data line 109, and fetches an error correcting code read from the error correcting code storage area 103 through a read error correcting code line 110. When the fetched data has no error, the decoder 105 sends the data to the I/O control circuit 106 through an output data line 111, and when the data has an error, the decoder 105 sends a corrected data to the I/O control circuit 106 through the output data line 111. The I/O control circuit 106 outputs the data output from the decoder 105 to a device externally provided to the ECC circuit memory block 101 through the I/O data line 112.

Now, an operation to write a data in the ECC circuit memory block 101 and an operation to read a data from the ECC circuit memory block 101 will be described in details by exemplifying a case where one word consists of an 8-bit data and a 4-bit error correcting code.

First, in writing a data in the ECC circuit memory block 101, an 8-bit data, (D0, D1, D2, D3, D4, D5, D6, D7), input through the data I/O line 112 from the external device is fetched by the I/O control circuit 106. This 8-bit data is written through the input data line 107 in the data storage area 102 by the I/O control circuit 106 and is also input to the error correcting code generator 104.

Next, the error correcting code generator 104 generates a 4-bit error correcting code, (C0, C1, C2, C3), corresponding to the input 8-bit data, and the error correcting code is written through the error correcting code line 108 in the error correcting code storage area 103. At this point, in the method described in the aforementioned publication, respective elements of the error correcting code, i.e., C0, C1, C2 and C3, are generated in accordance with the following Formulas (1):

Formulas (1):

$$C0 = D0 + D1 + D3 + D4 + D6$$

$$C1 = D0 + D2 + D3 + D5 + D6$$

$$C2 = D1 + D2 + D3 + D7$$

$$C3 = D4 + D5 + D6 + D7$$

In Formulas (1) and the following description, a symbol "+" indicates an exclusive OR.

Next, in reading a data from the ECC circuit memory block 101, the decoder 105 fetches an 8-bit data, (D0', D1', D2', D3', D4', D5', D6', D7'), read from the data storage area 102 through the read data line 109 and a 4-bit error correcting code, (C0', C1', C2', C3'), read from the error correcting code storage area 103 through the read error correcting code line 110. The decoder 105 then generates a 4-bit syndrome, (S0, S1, S2, S3), in accordance with the following formulas:

$$S0 = C0' + D0' + D1' + D3' + D4' + D6'$$

$$S1 = C1' + D0' + D2' + D3' + D5' + D6'$$

$$S2 = C2' + D1' + D2' + D3' + D7'$$

$$S3 = C3' + D4' + D5' + D6' + D7'$$

Then, in order to correct an error of each bit of the read 8-bit data, the decoder 105 inverts a bit detected as an error in the data, (D0', D1', D2', D3', D4', D5', D6', D7'), corresponding to the bit string of the syndrome, and outputs the resultant data to the output data line 111.

At this point, the data corresponding to the bit string of the syndrome (namely, a test matrix H) is represented by the following Formula (2):

Formula (2):

$$H = \begin{pmatrix} 1 & 1 & 0 & 1 & 1 & 0 & 1 & 0 & 1 & 0 & 0 & 0 \\ 1 & 0 & 1 & 1 & 0 & 1 & 1 & 0 & 0 & 1 & 0 & 0 \\ 0 & 1 & 1 & 1 & 0 & 0 & 0 & 1 & 0 & 0 & 1 & 0 \\ 0 & 0 & 0 & 0 & 1 & 1 & 1 & 1 & 0 & 0 & 0 & 1 \end{pmatrix}$$

When s=(S0, S1, S2, S3), the syndrome s is represented as follows:

$$s = (D0', D1', \ldots, D7', C0', \ldots, C3') H^T$$

It can be confirmed through vector calculation that the syndrome s does not includes information of the data itself but includes information of an error bit alone.

FIG. 12 is a table for showing the relationship between an error bit and a syndrome, which simply explains the meaning of Formula (2) above.

For example, when S0=1, S1=1, S2=1 and S3=0, the data of bit D3' is found to be an error, and hence, the data of this bit is corrected. On the other hand, when S0=S1=S2=S3=0, there is no error in the data, and hence, no bit data is inverted.

The 8-bit data resulting from this error correction is output to the output data line 111, so as to be output from the I/O control circuit 106 through the I/O data line 112 to the device externally provided to the ECC circuit memory block 101.

In this manner, a data is written in or read from the ECC circuit memory block 101.

Next, the structure and the operation of another semiconductor memory device containing an ECC circuit designated as a second conventional example will be described. FIG. 11 is a block diagram for schematically showing the structure of the semiconductor memory device disclosed in the aforementioned publication.

Since the ECC circuit of FIG. 10 alone is inconvenient for conducting a process other than the predetermined error correction, this device is improved for conducting various types of error corrections in consideration of the characteristics of the semiconductor memory device.

As is shown in FIG. 11, the semiconductor memory device of the second conventional example includes, in addition to the composing elements of the semiconductor memory device of FIG. 10, an error correcting code I/O control circuit 113.

In the circuit of FIG. 11, a test mode signal 117 is set to "0" in a general operation. Thus, a data can be written in and read from the ECC circuit memory block 101 in the same manner as in the operation of the first conventional example described above.

Next, an operation in a test mode will be described. When the test mode signal 117 is set to "1", selector gates 114 through 116 are controlled in accordance with the test mode signal 117. As a result, a data is written in the data storage area 102 by the I/O control circuit 106 through the input data line 107. Also, a data read from the data storage area 102 is output to the I/O control circuit 106 through the read data line 109 and the selector gate 114. In this case, the error correcting code generator 104 and the decoder 105 are not concerned with the data read/write operation, and hence, a data can be written in or read from the data storage area 102 through neither the error correcting code generator 104 nor the decoder 105, namely, directly.

On the other hand, an error correcting code, (C0, C1, C2, C3), is written in the error correcting code storage area 10 through the error correcting code I/O control circuit 113 and the selector gate 115 by a device externally provided to the ECC circuit memory block 101. Also, a data read from the error correcting code storage area 103 is output to a device externally provided to the ECC circuit memory block 101 through the selector gate 116 and the error correcting code I/O control circuit 113. In this manner, a data can be written in or read from the error correcting code storage area 103 directly.

In this manner, in the ECC circuit-containing semiconductor memory device of the second conventional example, errors of two or more bits are corrected by testing memory cells included in the data storage area 102 and the error correcting code storage area 103 by using, for example, checker pattern test data. This device is thus improved to be determined as a good product or a defective product.

The first and second conventional examples, however, have the following problems:

In the first conventional example, in the case where different test patterns (such as a checker pattern) should be respectively used for testing the data storage area and the error correcting code storage area, the test cannot be rapidly carried out.

In the second conventional example, although test patterns can be variously changed, the area occupied by the entire semiconductor memory device is increased on the contrary. Therefore, it is difficult to sufficiently meet demand for compactness of electronic equipment including the semiconductor memory device.

Furthermore, in the structure shown in FIG. 10 or 11, there is no means for testing an operation for correcting an error of the decoder 105, and there is a possibility that a 1-bit error cannot be accurately corrected. In other words, the reliability of an ECC circuit-containing semiconductor memory device cannot be sufficiently guaranteed by the conventional test method.

SUMMARY OF THE INVENTION

An object of the invention is providing a semiconductor memory device containing an ECC circuit with a simplified structure which can exhibit high performance suitable to compactness of electronic equipment for mounting the semiconductor memory device, and providing a test method for improving the reliability of the ECC circuit-containing semiconductor memory device.

The first ECC circuit-containing semiconductor memory device of this invention comprises error correcting code generation means for generating an error correcting code consisting of plural bits on the basis of a data consisting of plural bits; data storage means for storing the plural bits of the data; error correcting code storage means for storing the plural bits of the error correcting code; and decoding means having a function to correct an error of each bit of the data by calculating a syndrome for error correction on the basis of the data stored in the data storage means and the error correcting code stored in the error correcting code storage means, wherein the error correcting code generation means and the decoding means share a circuit.

In this manner, an error correcting code generating circuit and a decoder, which are separately provided in the conventional technique, can be constructed by using the shared circuit. As a result, the semiconductor memory device can be made compact.

The second ECC circuit-containing semiconductor memory device of this invention comprises error correcting code generation means for generating an error correcting code consisting of plural bits on the basis of a data consisting of plural bits; data storage means for storing the plural bits of the data; error correcting code storage means for storing the plural bits of the error correcting code; and decoding means having a function to correct an error of each bit of the data by calculating a syndrome for error correction on the basis of the data stored in the data storage means and the error correcting code stored in the error correcting code storage means, wherein the error correcting code generation means has a function to generate, in a test mode, a memory testing error correcting code in a pattern of the same type as a pattern of the data on the basis of the data.

In this manner, the semiconductor memory device can be provided with a function to detect a defect or the like derived from interference or the like between adjacent memory cells in each storage means by generating a checker pattern and a stripe pattern without additionally preparing error correcting code patterns for memory test.

The third ECC circuit-containing semiconductor memory device of this invention comprises error correcting code generation means for generating an error correcting code consisting of plural bits on the basis of a data consisting of plural bits; data storage means for storing the plural bits of the data; error correcting code storage means for storing the plural bits of the error correcting code; decoding means having a function to correct an error of each bit of the data by calculating a syndrome for error correction on the basis of the data stored in the data storage means and the error correcting code stored in the error correcting code storage means; and data input control means for arbitrarily change, in a test mode, a value of each bit of the data supplied to the error correcting code generation means, wherein the decoding means has a function to generate an arbitrary testing syndrome in the test mode.

In this manner, a defect of the decoding means can be detected, resulting in further improving the reliability of the ECC circuit-containing semiconductor memory device.

The fourth ECC circuit-containing semiconductor memory device of this invention comprises error correcting code generation means for generating an error correcting code consisting of plural bits on the basis of a data consisting of plural bits; data storage means for storing the plural bits of the data; error correcting code storage means for storing the plural bits of the error correcting code; decoding means having a function to correct an error of each bit of the data by calculating a syndrome for error correction on the basis of the data stored in the data storage means and the error correcting code stored in the error correcting code storage means; and data input control means for changing, in a test mode, a value of each bit of the data supplied to the error correcting code generation means, wherein the decoding means has a function to generate, in the test mode, a syndrome in such a pattern that no data bit is to be correspondingly corrected but any data bit is to be correspondingly corrected when any bit of the syndrome is inverted.

In this manner, a defect of the error correcting code storage means can be detected.

The first method of this invention of testing an ECC circuit-containing semiconductor memory device including error correcting code generation means for generating an error correcting code consisting of plural bits on the basis of a data consisting of plural bits, data storage means for storing the plural bits of the data, error correcting code storage means for storing the plural bits of the error correcting code, and decoding means having a function to correct an error of each bit of the data by calculating a syndrome for error correction on the basis of the data stored in the data storage means and the error correcting code stored in the error correcting code storage means, comprises the step of generating a memory testing data and a memory testing error correcting code in a pattern of the same type as a pattern of the memory testing data, and writing the memory testing data in the data storage means and the memory testing error correcting code in the error correcting code storage means for testing the data storage means and the error correcting code storage means.

In this manner, the storage means can be tested by generating various patterns for detecting a defect of each storage means of the ECC circuit-containing semiconductor memory device without additionally preparing test patterns.

In the first method of testing an ECC circuit-containing memory device, a defect derived from interference or the like between adjacent memory cells in each storage means by writing a checker pattern in the data storage means and the error correcting code storage means.

The second method of this invention of testing an ECC circuit-containing semiconductor memory device including error correcting code generation means for generating an error correcting code consisting of plural bits on the basis of a data consisting of plural bits, data storage means for storing the plural bits of the data, error correcting code storage means for storing the plural bits of the error correcting code, and decoding means having a function to correct an error of each bit of the data by calculating a syndrome for error correction on the basis of the data stored in the data storage means and the error correcting code stored in the error correcting code storage means, comprises the step of generating a memory testing data and a memory testing error correcting code each including, as arbitrary two bits, four types of patterns: (0 0), (0 1), (1, 0) and (1 1).

In this manner, defects of two or more bits included in a word can be detected.

The third method of this invention or testing an ECC circuit-containing semiconductor memory device including error correcting code generation means for generating an error correcting code consisting of plural bits on the basis of a data consisting of plural bits, data storage means for storing the plural bits of the data, error correcting code storage means for storing the plural bits of the error correcting code, and decoding means having a function to correct an error of each bit of the data by calculating a syndrome for error correction on the basis of the data stored in the data storage means and the error correcting code stored in the error correcting code storage means, comprises the step of generating an arbitrary testing syndrome by generating, from the data, a testing error correcting code in a pattern different from a pattern of the error correcting code.

In this manner, a defect of the decoding means can be detected.

The fourth method of this invention of testing an ECC circuit-containing semiconductor memory device including error correcting code generation means for generating an error correcting code consisting of plural bits on the basis of a data consisting of plural bits, data storage means for storing the plural bits of the data, error correcting code storage means for storing the plural bits of the error correcting code, and decoding means having a function to correct an error of each bit of the data by calculating a syndrome for error correction on the basis of the data stored in the data storage means and the error correcting code stored in the error correcting code storage means, comprises the step of generating, in a test mode, a syndrome in such a pattern that no data bit is to be correspondingly corrected but any data bit is to be correspondingly corrected when any bit of the syndrome is inverted.

In this manner, a defect of the error correcting code storage means can be detected.

BRIEF DESCRIPTION OF THE DRAWINGS

FIG. 5 is a diagram for showing a sate where a checker pattern is written in the memory cell array of Embodiment 2;

FIG. 9 is a diagram for showing the relationship between an error bit and a syndrome employed in Embodiment 5 of the invention;

FIG. 12 is a diagram for showing the relationship between an error bit and a syndrome employed in the conventional example.

DETAILED DESCRIPTION OF THE INVENTION

Embodiment 1

Figure 1:
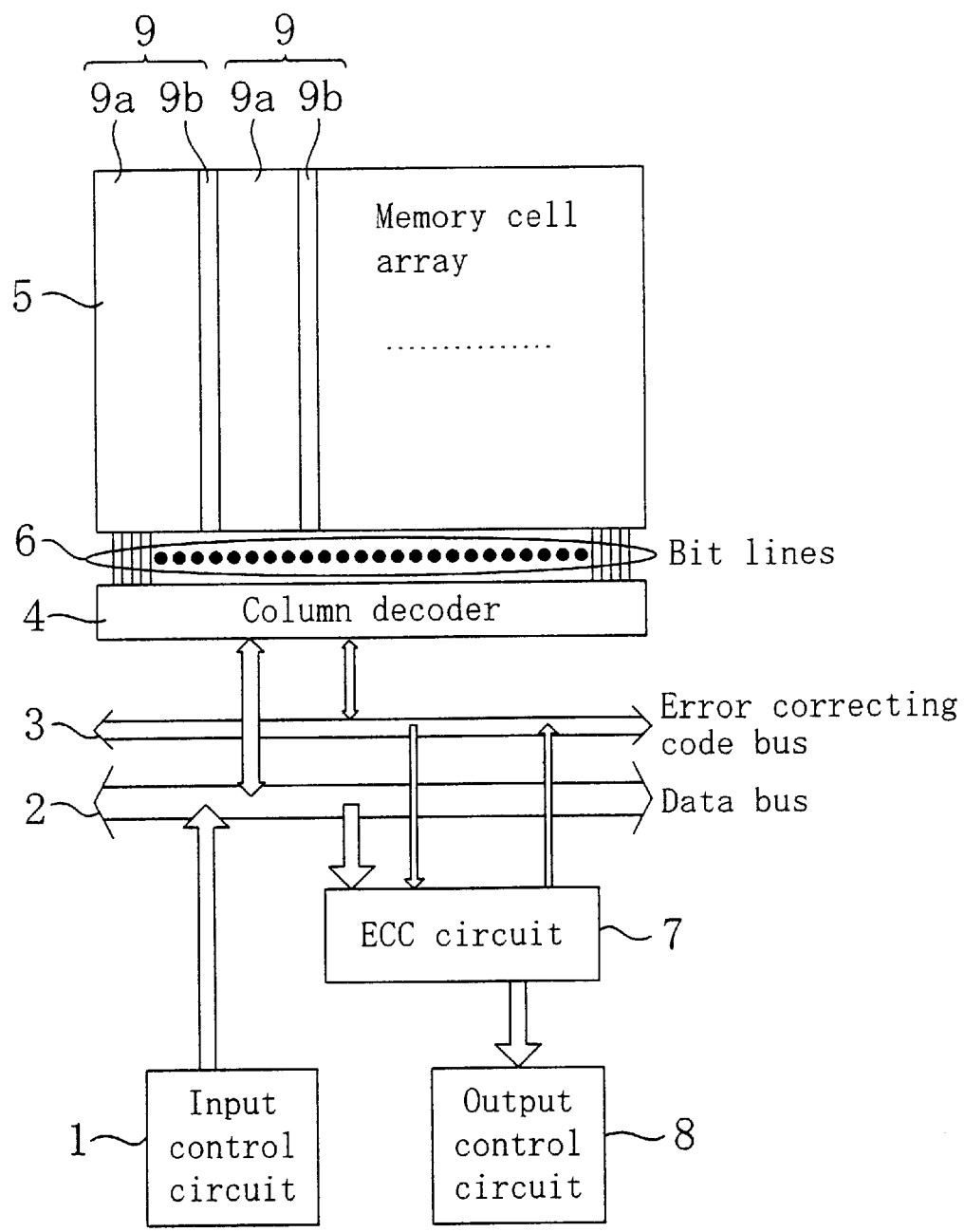
FIG. 1 is a block diagram for schematically showing the structure of an ECC circuit-containing semiconductor memory device according to Embodiment 1 of the invention.
Figure 4:
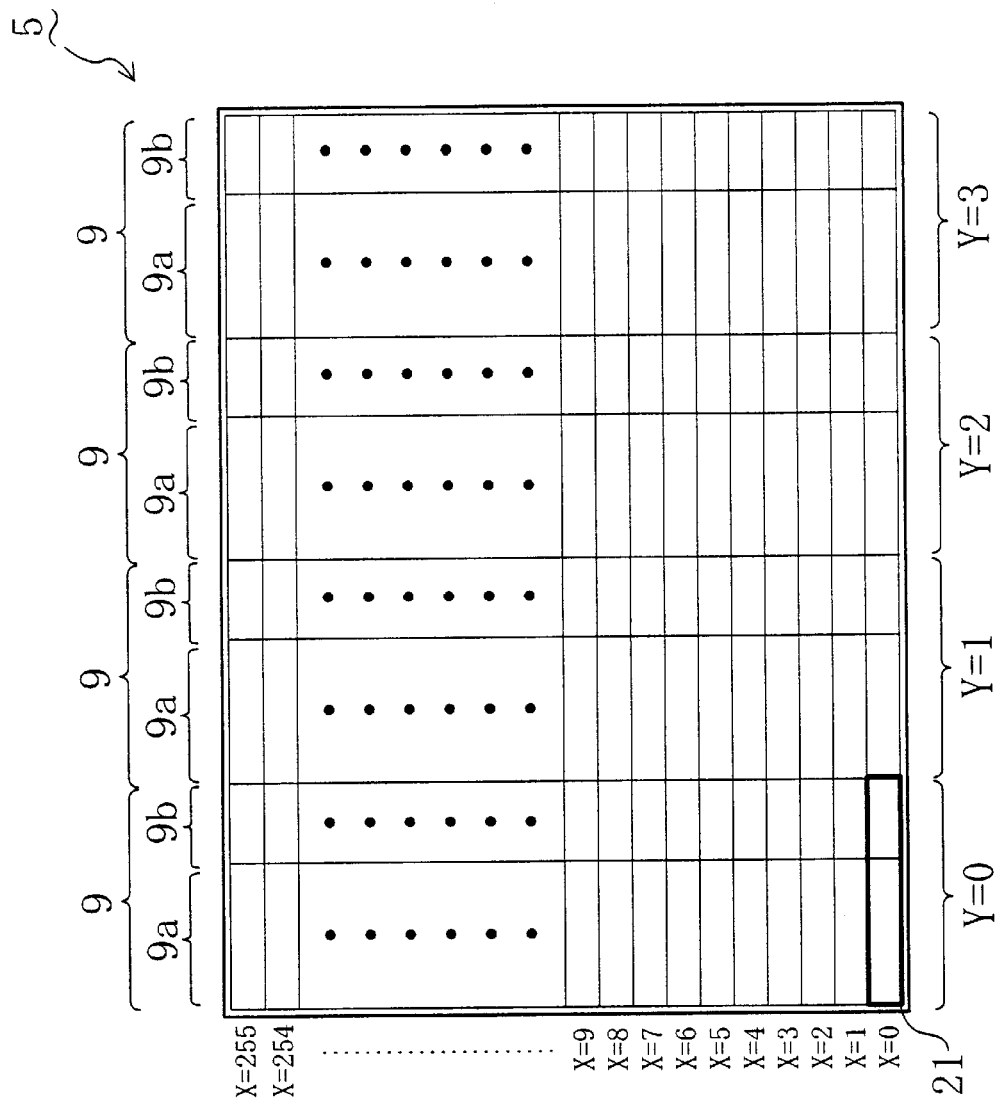
FIG. 4 is a diagram for schematically showing the structure of a memory cell array of Embodiment 2 of the invention.

FIG. 1 is a block diagram for schematically showing the structure of an ECC circuit-containing semiconductor memory device according to Embodiment 1 of the invention. As is shown in FIG. 1, the semiconductor memory device includes a memory cell array 5 where a large number of memory cells are arranged in the form of a matrix, and the memory cell array 5 is divided into plural memory blocks 9. Each memory block 9 includes a data storage area 9a and an error correcting code storage area 9b as is shown in FIG. 4. In the periphery of the memory cell array 5, a column decoder 4 for selecting a column and a row decoder (not shown) for selecting a row are disposed. The column decoder 4 and the row decoder are connected to the memory cell array 5 through a bit line group 6 and a word line group (not shown), respectively. Circuits provided to the row decoder are not concerned with the characteristics of the invention and hence are omitted in FIG. 1.

Main peripheral circuits are an input control circuit 1 for controlling data input in writing a data by a device externally provided to the ECC circuit-containing semiconductor memory device; an 8-bit data bus 2 for transferring a data; a 4-bit error correcting code bus 3 for transferring an error correcting code; an ECC circuit 7 having a function to generate an error correcting code from a data to be written in the memory cell array 5 and to generate a syndrome from a data and an error correcting code read from the memory cell array 5 for correcting an error in the data; and an output control circuit 8 for controlling output of data received from the ECC circuit 7 to a device externally provided to the ECC circuit-containing semiconductor memory device.

Now, read and write operations of the ECC circuit-containing semiconductor memory device having the aforementioned structure will be described.

First, in writing a data in the ECC circuit-containing semiconductor memory device, an 8-bit data, (D0, D1, D2, D3, D4, D5, D6, D7), is input from the external device of the semiconductor memory device to the input control circuit 1. The 8-bit data input to the input control circuit 1 is sent through the data bus 2 to the memory cell array 5 to be stored in the data storage area 9a and is also fetched by the ECC circuit 7. The ECC circuit 7 generates a 4-bit error correcting code, (C0, C1, C2, C3), on the basis of the 8-bit data fetched from the data bus 2. This error correcting code is sent through the error correcting code bus 3 and the column decoder 4 to the memory cell array 5 to be stored in the error correcting code storage area 9b. At this point, the data and the error correcting code are output to bit lines belonging to the bit line group 6 and corresponding to a data of 1 (one) word (corresponding to an 8-bit data+a 4-bit error correcting code and hereinafter referred to as the 1-word data), so as to be written in the memory cell array 5.

Next, in reading a data from the ECC circuit-containing semiconductor memory device, a 1-word data read from the memory cell array 5 is read through bit lines selected from the bit line group 6 by the column decoder 4 to the data bus 2 and the ECC bus 3. Then, an 8-bit data having passed through the data bus 2 and a 4-bit error correcting code having passed through the error correcting code bus 3 are fetched by the ECC circuit 7. The ECC circuit 7 generates a 4-bit syndrome, (S0, S1, S2, S3), on the basis of the 8-bit data and the 4-bit error correcting code. On the basis of this syndrome and with reference to the relationship between an error bit and a syndrome as shown in FIG. 12, an error correcting process is carried out, in which if the data has an error to be corrected, the data is corrected and if not, the data is allowed to remain the same, and then, the resultant 8-bit data is output to the output control circuit 8. The output control circuit 8 outputs the 8-bit data input from the ECC circuit 7 to the external device of the semiconductor memory device. Thus, the data read is completed.

Figure 2:
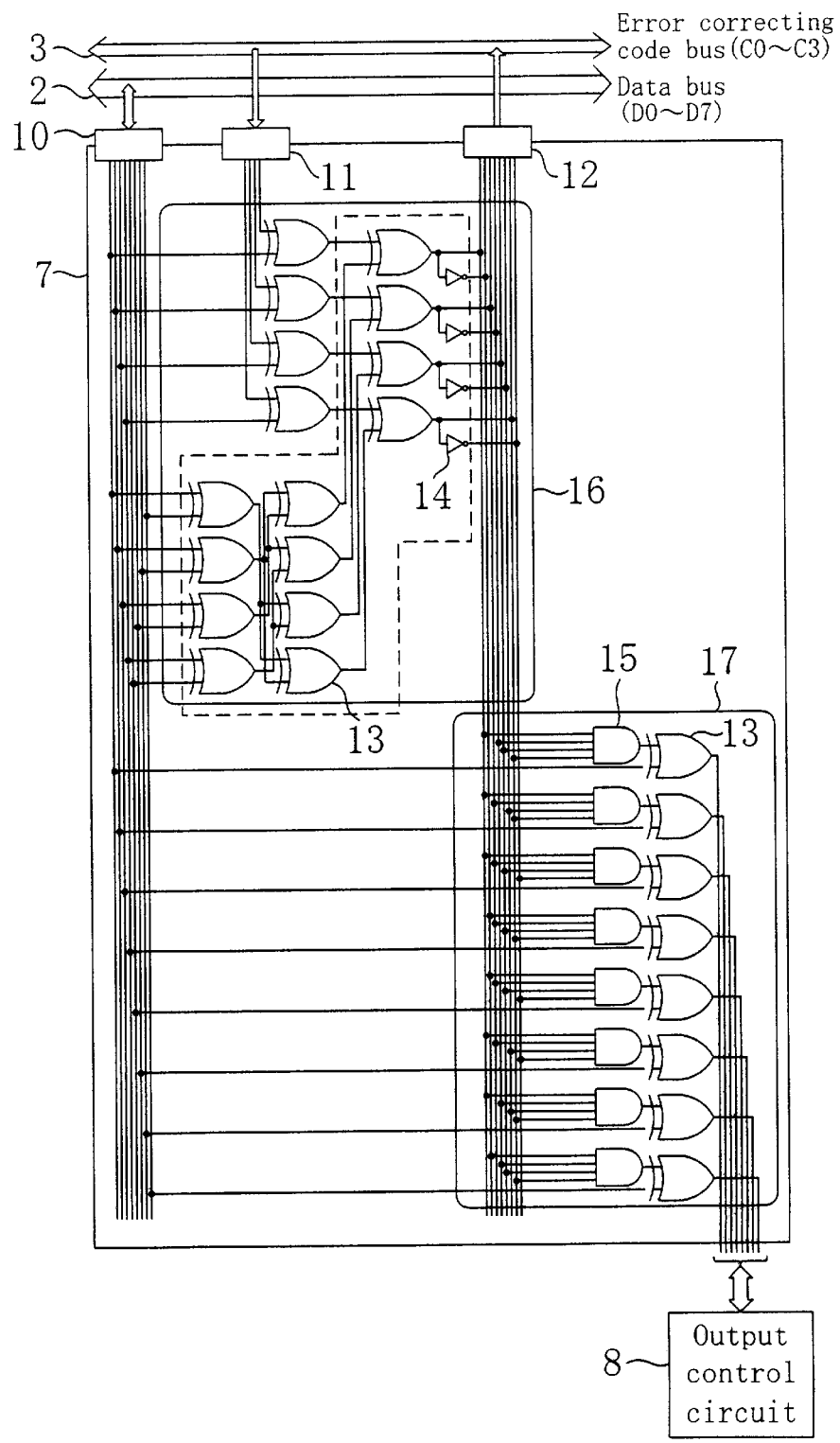
FIG. 2 is a circuit diagram of an ECC circuit of Embodiment 1.

FIG. 2 is a circuit diagram for showing the internal configuration of the ECC circuit 7 of FIG. 1. As is shown in FIG. 2, the ECC circuit 7 includes an error correcting code/syndrome generating circuit 16 and a data correcting circuit 17. In connecting portions between the ECC circuit 7 and the buses 2 and 3, a data bus input control circuit 10 for controlling input of a data from the data bus 2 to the ECC circuit 7; an error correcting code bus input control circuit 11 for controlling input of an error correcting code from the error correcting code bus 3 to the ECC circuit 7; and an error correcting code bus output control circuit 12 for controlling output of an error correcting code from the error correcting code bus 3 to the ECC circuit 7 are disposed. The error correcting code/syndrome generating circuit 16 includes combinations of exclusive OR gates 13 and inverter gates 14. The data correcting circuit 17 includes combinations of AND gates 15 and exclusive OR gates 13.

Figure 3:
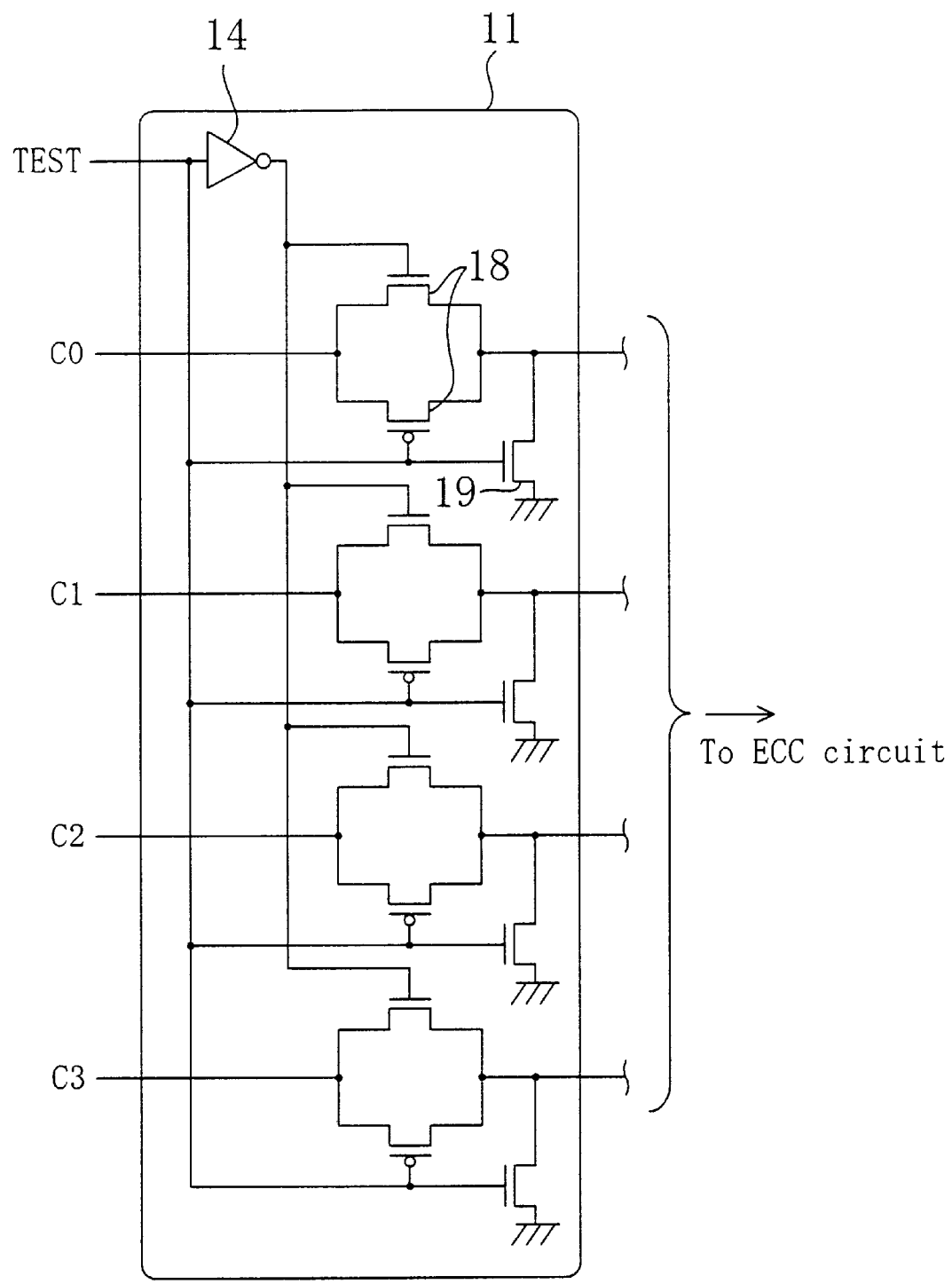
FIG. 3 is a circuit diagram for schematically showing the configuration of an error correcting code bus input control circuit of Embodiment 1.

FIG. 3 is a circuit diagram for schematically showing the configuration of the error correcting code bus input control circuit 11. As is shown in FIG. 3, the error correcting code bus input control circuit 11 includes an inverter 14 for inverting a test signal TEST, CMOS transfer gates 18 each including an N-channel MOS transistor and a P-channel MOS transistor for transferring an error correcting code to the ECC circuit 7, and N-channel MOS transistors 19 for fixing a signal to be sent to the ECC circuit 7 to a low level if necessary. When the test signal TEST is at a low level, the error correcting code, (C0, C1, C2, C3), is sent to the ECC circuit 7 by the CMOS transfer gates 18. When the test signal TEST is at a high level, the error correcting code, (C0, C1, C2, C3), is prevented from entering the ECC circuit 7 and the N-channel MOS transistors 19 fix a signal sent to the ECC circuit 7 to a low level.

—Specific Circuit Configuration—

Figure 10:
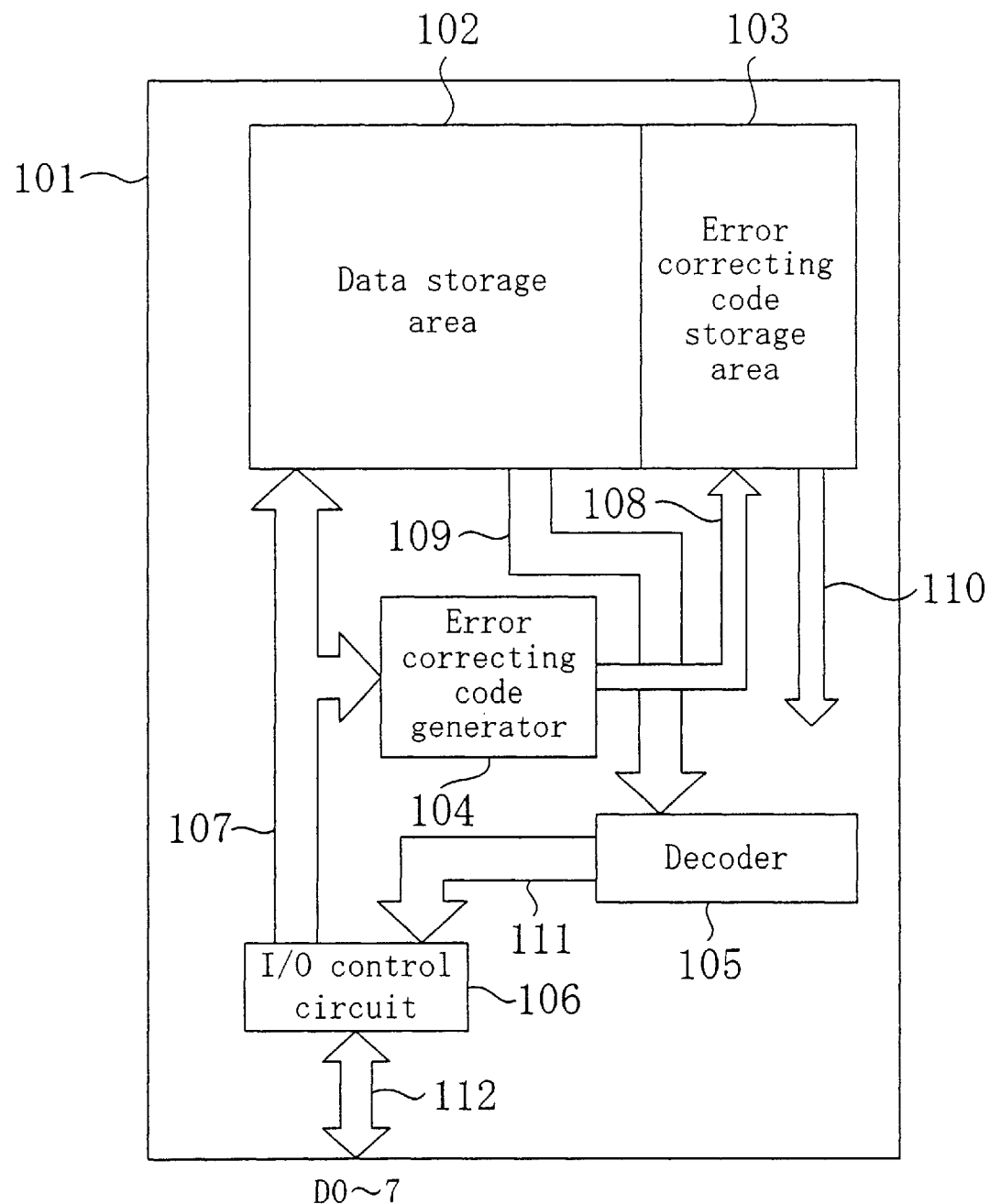
FIG. 10 is a block diagram for schematically showing the structure of an ECC circuit-containing semiconductor memory device according to a first conventional example.
Figure 11:
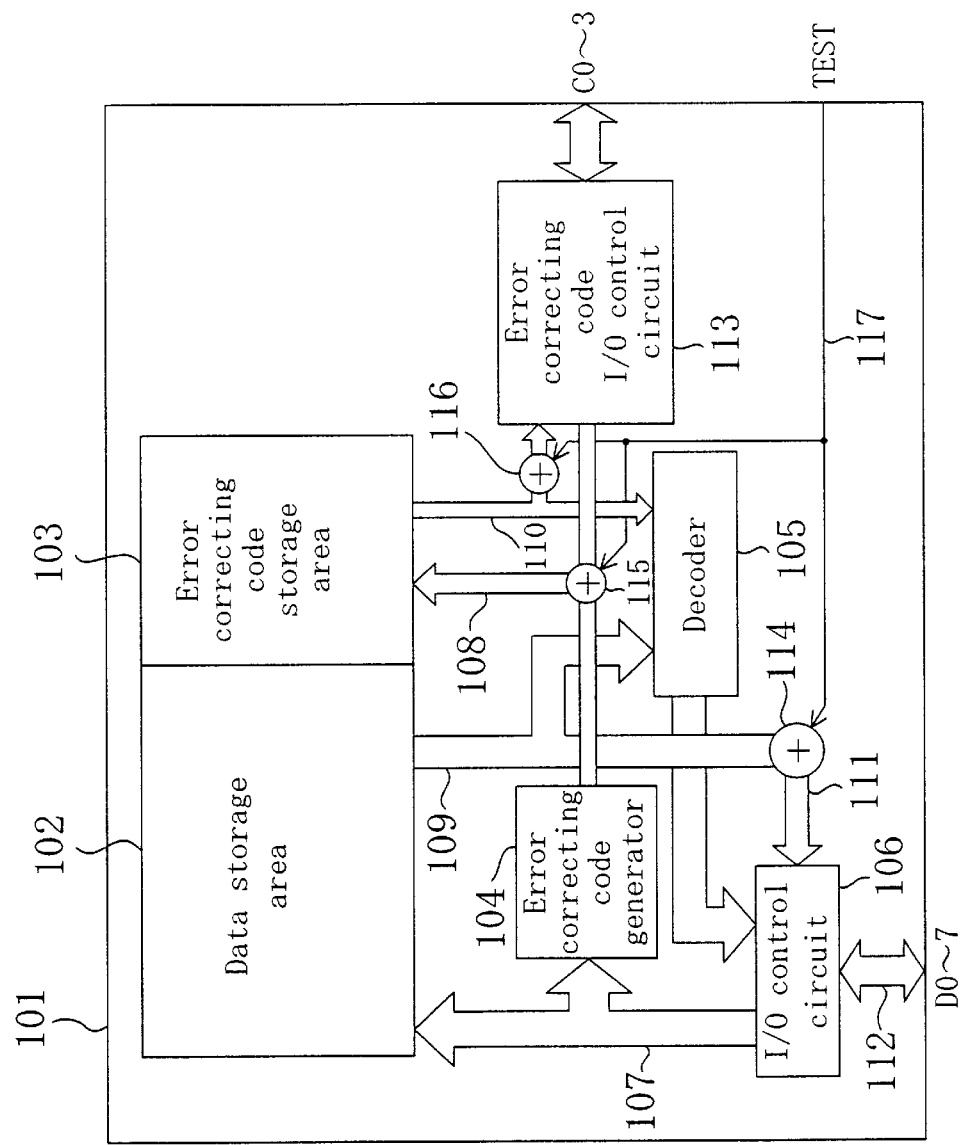
FIG. 11 is a block diagram for schematically showing the structure of an ECC circuit-containing semiconductor memory device according to a second conventional example.

In the ECC circuit-containing semiconductor memory device of this embodiment, as compared with the semiconductor memory devices of the first and second conventional examples shown in FIGS. 10 and 11, a part corresponding to the error correcting code generator 104, which is separately provided in the conventional examples, is included in the ECC circuit 7 as is shown in FIGS. 1, 2 and 3, so that the ECC circuit 7 can function both as the ECC generator 104 and the decoder 105. As a result, the entire device can attain compactness. Specifically, the error correcting code generator 104 used in the structure shown in FIG. 10 or 11 needs twelve exclusive OR gates, among the sixteen exclusive OR gates included in the error correcting code/syndrome generating circuit 16 of the ECC circuit 7 of this embodiment, and inverters (corresponding to a portion surrounded with a broken line in FIG. 2). In the conventional ECC circuit-containing semiconductor memory device, however, there is no need to provide the error correcting code bus input control circuit 11 as in this embodiment. In the other portions, there is substantially no difference in the circuit configuration between this embodiment and the conventional examples. Accordingly, considering that an exclusive OR gate includes at least six transistors and an inverter includes two transistors, the number of transistors can be reduced in the ECC circuit-containing semiconductor memory device of this embodiment as compared with that in the conventional ECC circuit-containing semiconductor memory device. As a result, the ECC circuit-containing semiconductor memory device of this embodiment can attain compactness.

—Operation Method—

Now, the operations for the error correcting code generation, the syndrome generation and the data correction of the ECC circuit 7 having the above-described structure and its circuit operations corresponding to these operations will be described.

First, the following Formulas (3) are used in the operation for generating a 4-bit error correcting code from eight data bits:

Formulas (3):

$$C0 = D0 + D1 + D2 + D5 + D6$$

$$C1 = D1 + D2 + D3 + D4 + D5$$

$$C2 = D0 + D2 + D3 + D4 + D7$$

$$C3 = D0 + D1 + D3 + D6 + D7$$

It is understood from Formulas (3) that the ECC circuit-containing semiconductor memory device of this embodiment has the following two characteristics:

The first characteristic is that the same number of bits are assigned for calculating the respective bits, C0, C1, C2 and C3, of the error correcting code. In Formulas (3), a 5-bit data is assigned for calculating each bit of the error correcting code. For example, a 5-bit data, (D0, D1, D2, D5, D6), is assigned for calculating bit C0 of the error correcting code. As a result, the number of gates used for realizing the calculation by the circuit is constant between respective bits of the error correcting code, and hence, the circuit delay cannot be varied. In contrast, when the error correcting code represented by the conventional Formulas (1) is used, five data bits are assigned for one bit C0 of the error correcting code while four data bits are assigned for another bit C3 of the error correcting code, which may vary the circuit delay.

The second characteristic is that the error correcting code of four bits is generated in a pattern of the same type as the pattern of the data of eight bits. For example, in the case where a checker pattern is written as a data, namely, when (D0, D1, D2, D3, D4, D5, D6, D7)=(0, 1, 0, 1, 0, 1, 0, 1), the error correcting code, (C0, C1, C2, C3)=(0, 1, 0, 1). Thus, the resultant error correcting code is also in the checker pattern. Also, in order to generate a stripe pattern, it is necessary to generate an "all-0 (zero) pattern" and an "all-1 (one) pattern", but when all the data bits are "1", the bits of the resultant error correcting code are all "1".

In contrast, in using the conventional error correcting code represented by Formulas (1), when (D0, D1, D2, D3, D4, D5, D6, D7)=(0, 1, 0, 1, 0, 1, 0, 1), the resultant error correcting code, (C0, C1, C2, C3)=(0, 0, 0, 1), and thus, the error correcting code cannot be in the checker pattern. Also, when all the data bits are "1", the bits of the resultant error correcting code cannot be all "1".

The checker pattern and the stripe pattern are effective test patterns for detecting a defect such as interference between physically adjacent memory cells (each corresponding to a bit) in a test of memory cells. In the conventional ECC circuit-containing semiconductor memory device, however, it is necessary to use a dedicated test pattern for conducting a test using the checker pattern or the stripe pattern. On the contrary, in the ECC circuit-containing semiconductor memory device of this embodiment, since the generated error correcting code pattern is of the same type as the pattern of the data, error correcting codes suitable for various tests can be generated by using data patterns without additionally preparing various types of test patterns. Accordingly, the number of test patterns necessary to be prepared can be reduced.

Formulas (3) can be changed as follows:

$$C0 = (D1+D6)+(D2+D5)+D0$$

$$C1 = (D2+D5)+(D3+D4)+D1$$

$$C2 = (D0+D7)+(D3+D4)+D2$$

$$C3 = (D0+D7)+(D1+D6)+D3$$

Also when thus changed, it is easily understood that the respective bits of the error correcting code are equal to those of Formulas (3). Specifically, the result of the calculation in each parenthesis can be shared. For example, a value resulting from the calculation, (D0+D7), can be used in the calculation of both bits C2 and C3 of the error correcting code. Accordingly, the operation speed can be increased.

On the other hand, Formulas (4) used for generating a syndrome corresponding to Formulas (3) for generating the error correcting code are represented as follows:

Formulas (4):

$$S0 = C0+D0+D1+D2+D5+D6$$

$$S1 = C1+D1+D2+D3+D4+D5$$

$$S2 = C2+D0+D2+D3+D4+D7$$

$$S3 = C3+D0+D1+D3+D6+D7$$

Formulas (4) can be changed as follows:

$$S0 = (D1+D6)+(D2+D5)+(D0+C0)$$

$$S1 = (D2+D5)+(D3+D4)+(D1+C1)$$

$$S2 = (D0+D7)+(D3+D4)+(D2+C2)$$

$$S3 = (D0+D7)+(D1+D6)+(D3+C3)$$

It is understood from comparison between Formulas (3) and (4) that they include a large number of common components. Accordingly, also in the generation of an error correcting code and the generation of a syndrome, the circuit can be shared, so as to increase the operation speed.

Furthermore, data correction carried out in detecting an error as a result of generating a syndrome is conducted in accordance with the following Formulas (5):

Formulas (5):

$$(S0 \cdot /S1 \cdot S2 \cdot S3) + D0 \rightarrow D0$$

$$(S0 \cdot S1 \cdot /S2 \cdot S3) + D1 \rightarrow D1$$

$$(S0 \cdot S1 \cdot S2 \cdot /S3) + D2 \rightarrow D2$$

$$(/S0 \cdot S1 \cdot S2 \cdot S3) + D3 \rightarrow D3$$

$$(/S0 \cdot S1 \cdot S2 \cdot /S3) + D4 \rightarrow D4$$

$(S0 \cdot S1 \cdot /S2 \cdot /S3) + D5 \rightarrow D5$ $(S0 \cdot /S1 \cdot /S2 \cdot S3) + D6 \rightarrow D6$ $(/S0 \cdot /S1 \cdot S2 \cdot S3) + D7 \rightarrow D7$ In Formulas (5), the symbol "·" indicates a conjunction and the symbol"/" indicates inversion of a data. For example, "/S0" means "1" when S0 is "0" and means "0" when S0 is "1". The symbol "→" indicates substitution of the calculation result on the left side in the right side. Specifically, Formulas (5) means that a data bit is not changed when the calculation result in the parenthesis is "0" and is inverted when the calculation result in the parenthesis is "1". For example, when a syndrome is (1011), it is decided that bit D0 is an error, so as to be corrected through inversion. Alternatively, when a syndrome is (1100), bit D5 is inverted for correction.

The following Formula (6) represents a test matrix H used in the ECC circuit-containing semiconductor memory device of this embodiment and corresponding to Formula (2) described as the conventional technique:

Formula (6):

$$H = \begin{pmatrix} 1 & 1 & 1 & 0 & 0 & 1 & 1 & 0 & 1 & 0 & 0 & 0 \\ 0 & 1 & 1 & 1 & 1 & 1 & 0 & 0 & 0 & 1 & 0 & 0 \\ 1 & 0 & 1 & 1 & 1 & 0 & 0 & 1 & 0 & 0 & 1 & 0 \\ 1 & 1 & 0 & 1 & 0 & 0 & 1 & 1 & 0 & 0 & 0 & 1 \end{pmatrix}$$

Also as described with respect to the conventional technique, the syndrome s is represented by the following formula:

$s = (D0, D1, \ldots, D7, C0, \ldots, C3)H^T$

FIG. 9 is a diagram for showing the relationship between an error bit and a syndrome according to this embodiment.

—Circuit Operation—

The circuit operation of the ECC circuit-containing semiconductor memory device of this embodiment will now be described.

In generating an error correcting code, an 8-bit data on the data bus 2 is input from the data bus input control circuit 10 to the ECC circuit 7. The input to the ECC circuit 7 is fixed to "0" by the error correcting code input control circuit 11. Then, the error correcting code/syndrome generating circuit 16 generates an error correcting code in accordance with Formulas (3), and the obtained 4-bit error correcting code is sent from the error correcting code bus output control circuit 12 through the error correcting code bus 3 to the memory cell array.

In generating a syndrome, an 8-bit data on the data bus 2 is input from the data bus input control circuit 10 to the ECC circuit 7. Also, a 4-bit error correcting code fetched from the memory cell array to the error correcting code bus 3 is input from the error correcting code input control circuit 11 to the ECC circuit 7. Then, the error correcting code/syndrome generating circuit 16 generates a syndrome in accordance with Formulas (4), and the data correcting circuit 17 corrects the data on the basis of Formulas (5) if necessary. Furthermore, the resultant 8-bit data is output from the output control circuit 8 to the external device of the semiconductor memory device.

In this manner, in the circuit operation of the ECC circuit-containing semiconductor memory device of this embodiment, since the same number of data bits are used in calculating each bit of the error correcting code as described above (as represented by Formulas (3)), the circuit delay caused in calculating the respective bits for generating the error correcting code can be constant, resulting in smoothly generating the error correcting code.

In Formulas (3) used for calculating the respective bits of the error correcting code, arbitrary two bits of the data bits can be exchanged plural times as described above, and also in Formulas (4) used for calculating the respective bits of the syndrome, arbitrary two bits of the data bits can be exchanged plural times.

Also, Formulas (3) can be changed as follows by replacing bits C0 and C1 with each other:

$C0 = D1 + D2 + D3 + D4 + D5$ $C1 = D0 + D1 + D2 + D5 + D6$ $C2 = D0 + D2 + D3 + D4 + D7$ $C3 = D0 + D1 + D3 + D6 + D7$

Thus, arbitrary two bits of the error correcting code can be exchanged plural times.

When a 16-bit data (D0, . . . , D15) and a 5-bit error correcting code (C1, . . . , C4) are used, the error correcting code can be calculated as follows:

$C0 = D0 + D1 + D3 + D4 + D6 + D8 + D9 + D13 + D14$ $C1 = D1 + D2 + D3 + D7 + D8 + D9 + D10 + D11 + D12$ $C2 = D0 + D2 + D3 + D5 + D6 + D9 + D10 + D12 + D13$ $C3 = D4 + D5 + D6 + D7 + D8 + D9 + D10 + D11 + D15$ $C4 = D0 + D1 + D2 + D4 + D5 + D7 + D10 + D14 + D15$

Embodiment 2

FIG. 4 is a diagram for schematically showing the structure of a memory cell array 5 of an ECC circuit-containing semiconductor memory device according to Embodiment 2 of the invention. As is shown in FIG. 4, the memory cell array 5 is divided into four memory blocks 9, each of which includes a data storage area 9a and an error correcting code storage area 9b. The row number in the memory cell array 5 is indicated as X (=0, 1, 2, . . . or 255), and the number of each memory block 9 is indicated as Y (=0, 1, 2 or 3). The data storage area 9a and the error correcting code storage area 9b of each memory block 9 together serve as a memory cell block corresponding to one word, and this memory block corresponding to one word is designated as a "unit word block".

It is assumed also in this embodiment that a 4-bit error correcting code is generated from an 8-bit data by using Formulas (3) described in Embodiment 1. In other words, this embodiment is also characterized by generating, from an 8-bit data, a 4-bit error correcting code in a pattern of the same type as that of the data.

This error correcting code pattern has the following regularity: To a formula for calculating an error correcting code bit with an even subscript, an odd number of data bits with even subscripts and an even number of data bits with odd subscripts are assigned. For example, to bit C0 with an even subscript of the error correcting code, an odd number of data bits with even subscripts (namely, D0, D2 and D6) and an even number of data bits with odd subscripts (namely, D1 and D5) are assigned. On the other hand, to a formula for calculating an error correcting code bit with an odd subscript, an odd number of data bits with odd subscripts and an even number of data bits with even subscripts are assigned. For example, to bit C1 with an odd subscript of the error correcting code, an odd number of data bits with odd subscripts (namely, D1, D3 and D5) and an even number of data bits with even subscripts (namely, D2 and D4) are assigned.

In test patterns that can be generated in accordance with the aforementioned regularity, the correspondence between specific data bits and error correcting code bits is exemplified as follows:

| Pattern Name | (D0, ... , D7) | (C0, ... , C3) |
|---|---|---|
| All-0 | (0 0 0 0 0 0 0 0) | (0 0 0 0) |
| All-1 | (1 1 1 1 1 1 1 1) | (1 1 1 1) |
| Checker | (0 1 0 1 0 1 0 1) | (0 1 0 1) |
| Checker bar | (1 0 1 0 1 0 1 0) | (1 0 1 0) |

In writing a data "0" in all the memory cells in the memory cell array 5 (including the data storage areas and the error correcting code storage areas), a write operation is conducted with the data bits (and the error correcting code bits) in all the addresses in the memory cell array 5 set to "0". In writing a data "1" in all the memory cells in the memory cell array 5, a write operation is conducted with the data bits (and the error correcting code bits) in all the addresses in the memory cell array 5 set to "1".

In writing the checker pattern in the entire memory cell array 5, a partial checker pattern, which starts with "0" followed by "1" and "0" alternately repeated, is written in each unit word block 21 in all addresses having the row number X of 0. In each unit word block 21 in all addresses having the row number X of 1, a partial checker bar pattern, which starts with "1" followed by "0" and "1" alternately repeated, is written. Furthermore, the partial checker pattern is written in each unit word block 21 in addresses having the row number X of 2. In other words, the checker pattern can be written in the entire memory cell array 5 by writing the partial checker pattern in all the unit word blocks 21 in the addresses having an even row number X and writing the partial checker bar pattern in all the unit word blocks 21 in the addresses having an odd row number X.

FIG. 5 is a diagram for showing a state in which the checker pattern has been written in the entire memory cell array 5 in the aforementioned manner.

Moreover, in writing a stripe pattern along the row direction (lateral stripe pattern) in the memory cell array 5, a partial all-0 pattern is written in each unit word block 21 in all addresses having, for example, an even row number X and a partial all-1 pattern is written in each unit word block 21 in all addresses having an odd row number X. In writing a stripe pattern along the column direction (vertical stripe pattern) in the memory cell array 5, the partial checker pattern or the partial checker bar pattern is written in all the unit word blocks 21 of each row.

In this manner, this embodiment employs the rule for generating an error correcting code in which an odd number of data bits with even subscripts and an even number of data bits with odd subscripts are assigned to a formula for calculating an error correcting code bit with an even subscript and an odd number of data bits with odd subscripts and an even number of data bits with even subscripts are assigned to a formula for calculating an error correcting code bit with an odd subscript. Accordingly, an error correcting code in the partial checker pattern can be generated by using a data in the partial checker pattern, an error correcting code in the partial checker bar pattern can be generated by using a data in the partial checker bar pattern, an error correcting code in the partial all-0 pattern can be generated by using a data in the partial all-0 pattern, and an error correcting code in the partial all-1 pattern can be generated by using a data in the partial all-1 pattern. When the respective memory cells in the memory cell array 5 are tested by using such various patterns, a defect such as interference between memory cells (bits) adjacent to each other in any direction can be detected.

Accordingly, in the method of generating an error correcting code of this embodiment, since a data pattern can be used for generating an error correcting code pattern of the same type, a defect such as interference between memory cells (bits) adjacent to each other in any direction can be advantageously detected in the memory test without additionally preparing test patterns dedicated to error correcting codes.

Embodiment 3

Figure 6:
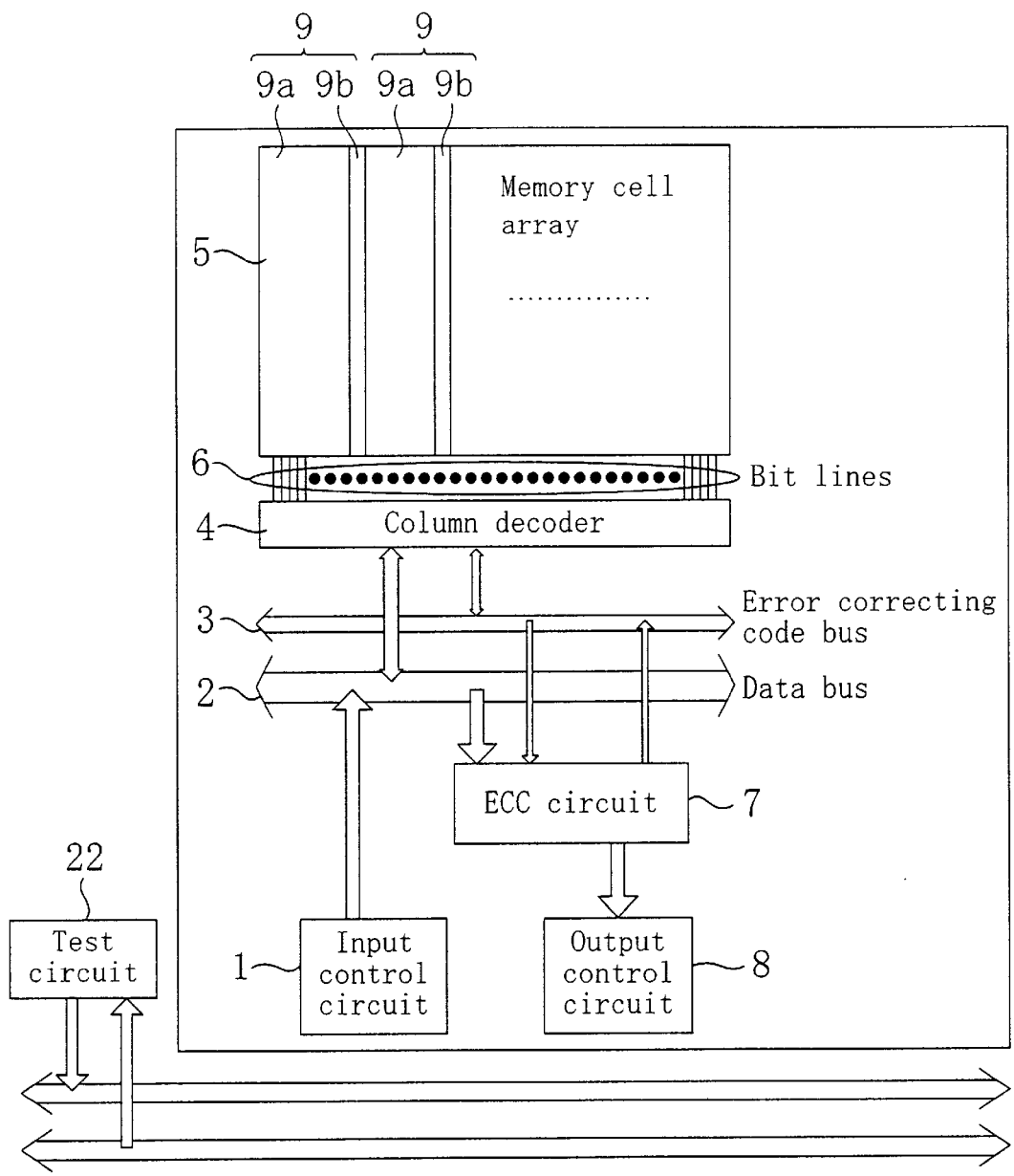
FIG. 6 is a block diagram for schematically showing the structure of an ECC circuit-containing semiconductor memory device according to Embodiment 3 of the invention.

FIG. 6 is a block diagram for showing the structure of an ECC circuit-containing semiconductor memory device according to Embodiment 3 of the invention.

As is shown in FIG. 6, the structure of the ECC circuit-containing semiconductor memory device of this embodiment is substantially the same as that of Embodiment 1 (shown in FIG. 1). The structure of this embodiment additionally includes a test circuit 22 for conducting a memory test by outputting a test pattern to the input control circuit 1 of the ECC circuit-containing semiconductor memory device and inputting the test pattern from the output control circuit 8, and this embodiment is characterized by a test method employed by this test circuit 22.

As described with respect to the conventional technique, in an ECC circuit-containing memory device capable of correcting a 1-bit error, in order to conduct a memory test without using a signal line for inputting/outputting an error correcting code between an ECC circuit memory block and an external device, it is necessary to detect defects of two or more bits included in one word through a test using data bits alone. By using conventional memory test patterns, however, defects of two or more bits cannot be detected. For example, when four test patterns, (D0 D1 D2 D3 D4 D5 D6 D7), namely, the all-0 pattern, (0 0 0 0 0 0 0 0); the all-1 pattern, (1 1 1 1 1 1 1 1); the checker pattern, (0 1 0 1 0 1 0 1); and the checker bar pattern, (1 0 1 0 1 0 1 0), are used, a defective mode in which bits D0 and D2 are respectively fixed to "0" and "1" is identified as a 1-bit error in the respective four patterns and hence cannot be detected.

In this embodiment, the following nine patterns are used as test patterns for data bits generated by the test circuit 22:

(D0 D1 D2 D3 D4 D5 D6 D7 C0 C1 C2 C3 )

Pattern 1 (0 0 0 0 0 0 0 0 0 0 0 0)
Pattern 2 (1 1 1 1 1 1 1 1 1 1 1 1)
Pattern 3 (0 1 0 1 0 1 0 1 0 1 0 1)
Pattern 4 (1 0 1 0 1 0 1 0 1 0 1 0)
Pattern 5 (0 0 1 1 0 0 1 1 0 0 1 1)
Pattern 6 (1 1 0 0 1 1 0 0 1 1 0 0)
Pattern 7 (1 1 1 1 0 0 0 0 1 1 1 1)
Pattern 8 (0 1 0 1 1 1 1 1 1 0 1 0)
Pattern 9 (1 0 1 0 1 1 1 1 0 1 0 1)

As a rule for generating the nine patterns, each test pattern always includes four kinds of patterns, (0 0), (0 1), (1 0) and (1 1), as combinations of arbitrary two bits including bits not adjacent to each other in the respective bits thereof. When the test is conducted by the test circuit 22 by using the nine patterns, arbitrary two bits having a defect can be detected as a 2-bit defect in any one or more of the test patterns. Since the test circuit 22 for generating the patterns is thus provided, defects of two or more bits can be detected in both data bits and error correcting code bits in the memory cell array of the ECC circuit-containing semiconductor memory device.

The test circuit 22 can be or may not be built in a semiconductor chip. When the test circuit 22 is built in a semiconductor chip, however, defects of two or more bits of memory cells can be detected without increasing the number of input/output signal lines connected to external devices.

The test circuit 22 for generating the test patterns for detecting a 2-bit defect can be realized by using a microprocessor.

Figure 7:
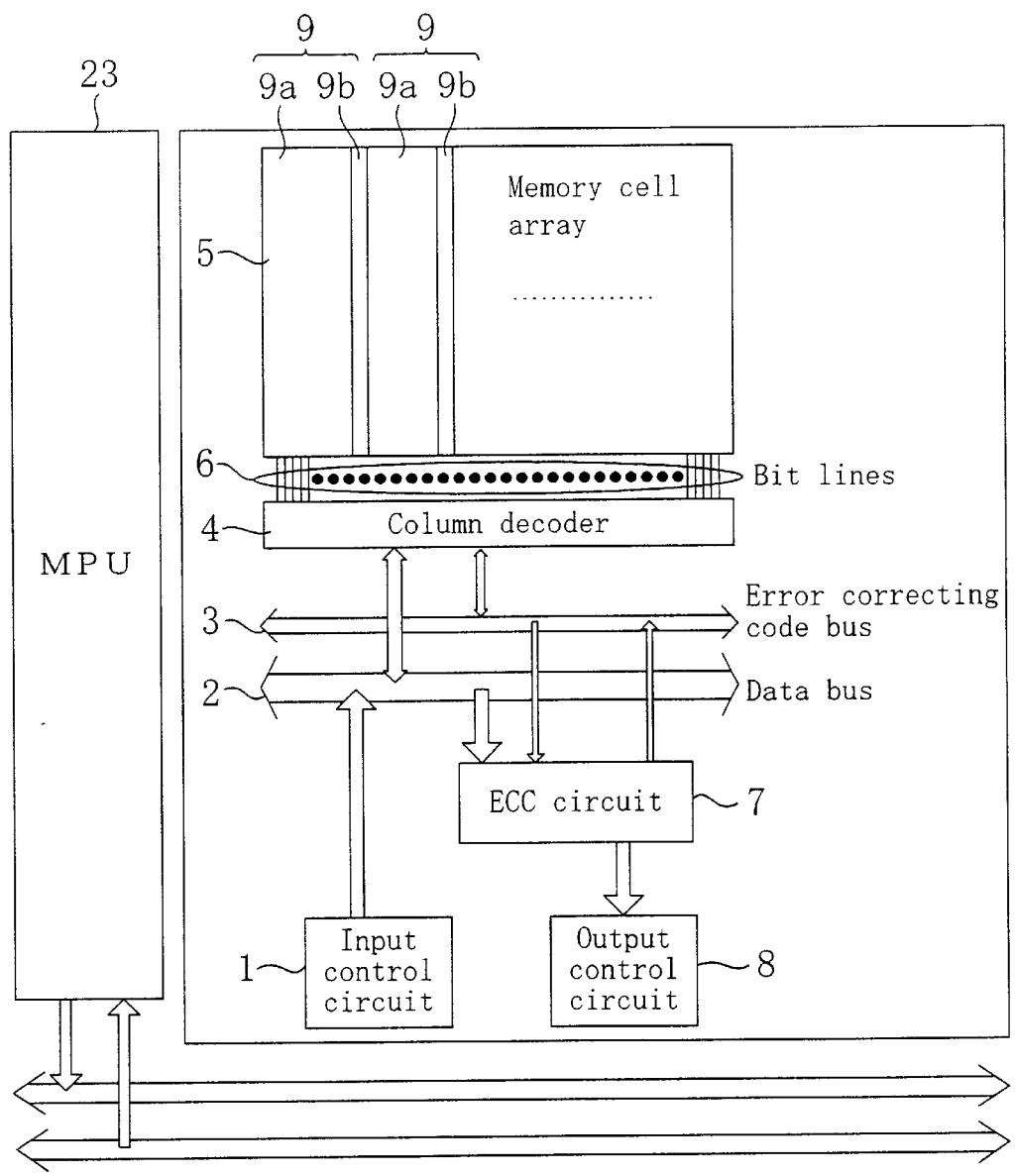
FIG. 7 is a block diagram for schematically showing the structure of an ECC circuit-containing semiconductor memory device according to modification of Embodiment 3.

FIG. 7 is a block diagram for showing an exemplified structure for employing the test method of this embodiment by using a microprocessor 23 instead of the test circuit 22. In this case, the structure is suitable to a semiconductor device including both a memory and a logic circuit.

When hardware such as a tester is additionally provided, data bits in the memory cells can be directly accessed.

Embodiment 4

Figure 8:
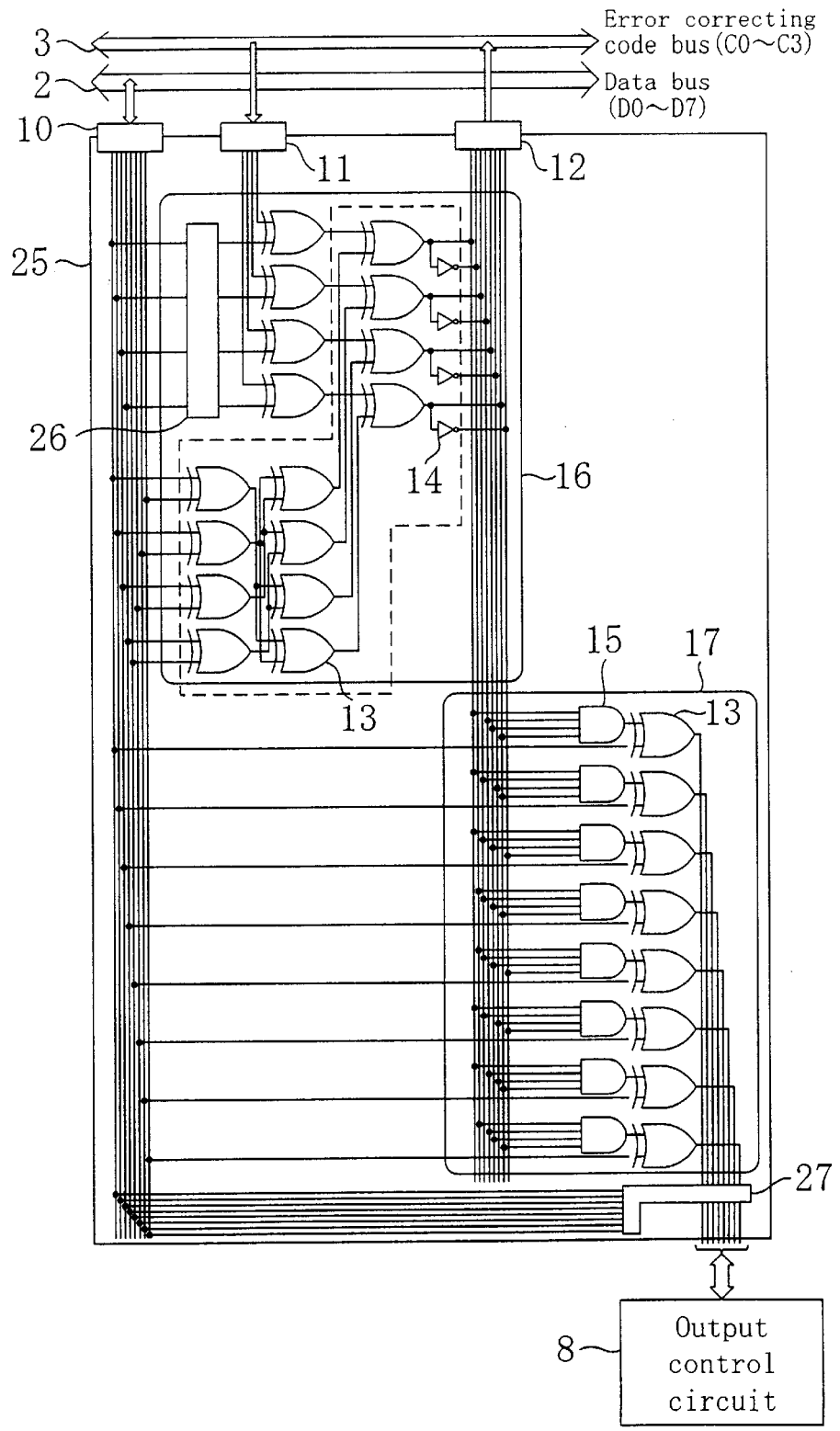
FIG. 8 is a circuit diagram of an ECC circuit of Embodiment 4 of the invention.

FIG. 8 is a circuit diagram for showing the structure of a part (an ECC circuit, in particular) of an ECC circuit-containing semiconductor memory device according to Embodiment 4 of the invention. The entire structure of the ECC circuit-containing semiconductor memory device is the same as that shown in FIG. 1.

As is shown in FIG. 8, the ECC circuit 25 of this embodiment includes, in addition to the composing elements of the ECC circuit 7 shown in FIG. 2, a data bus input test control circuit 26 for determining whether or not a data, (D0, D1, D2, D3), fetched from the data bus 2 is input to exclusive OR gates for generating an error correcting code, and a selector gate 27 for selecting an input from the data bus input control circuit 10 or an input from the data correcting circuit 17 to be sent to the output control circuit 8.

Now, operations for normal write, test mode write, normal read and test mode read and the corresponding circuit operations of the ECC circuit 25 having the aforementioned structure will be described.

In the normal write operation, Formulas (3) described in Embodiment 1 are used for generating a 4-bit error correcting code from an 8-bit data. Also, in the normal read operation, a syndrome is generated by using Formulas (4) described in Embodiment 1.

In the test mode write operation, the following Formulas (7) are used:

$C0 = (D1+D6)+(D2+D5)$ $C1 = (D2+D5)+(D3+D4)$ $C2 = (D0+D7)+(D3+D4)$ $C3 = (D0+D7)+(D1+D6)$

Also, in the test mode read operation, the read 8-bit data is directly output.

As a characteristic of Formulas (7) used in the test mode write operation, one bit D0, D1, D2, or D3 is omitted from the right side of each Formula (3) used for generating an error correcting code. For this purpose, the data bus input test control circuit 26 included in the ECC circuit 25 cuts passage of the first four bits, (D0, D1, D2, D3), of the 8-bit data.

Therefore, when the normal read operation is conducted after the test mode write operation, a syndrome, (S0, S1, S2, S3), generated when no bit error occurs can be obtained by substituting Formulas (7) in Formulas (4), and is not (0, 0, 0, 0) but equal to (D0, D1, D2, D3). In other words, an optional syndrome can be set in accordance with externally input data bits.

Next, the circuit operation will be described. In the test mode write operation, the data bus input control circuit 10 inputs an 8-bit data on the data bus 2 to the ECC circuit 25. The data bus input test control circuit 26 fixes the output to the error correcting code/syndrome generating circuit 16 to "0". The error correcting code input control circuit 11 fixes the input to the ECC circuit 25 to "0". An error correcting code is generated by the error correcting code/syndrome generating circuit 16 corresponding to Formulas (7), and the resultant 4-bit error correcting code for the test is output from the error correcting code bus output control circuit 12 to the Error correcting code bus 3.

In generating a syndrome, the data bus input control circuit 10 inputs an 8-bit data on the data bus 2 to the ECC circuit 25. The selector gate 27 directly outputs the received 8-bit data from the output control circuit 8 to an external device.

In order to test the data correcting circuit 17, data bits D0, D1, D2 and D4 are set to the same pattern as the syndrome, (S0, S1, S3, S3), to be correspondingly corrected. In other words, a multifunctional test can be carried out when the data bits D0, D1, D2 and D4 are in the same pattern as the pattern of the syndrome, (S0, S1, S2, S3), shown on each row of FIG. 9. For example, when the test mode write operation is conducted with the data bits D0, D1, D2, and D4 set to a pattern (1, 0, 1, 1) the same as the syndrome, (S0, S1, S2, S3), shown on the first row of FIG. 9 and the normal read operation is conducted, the syndrome, (S0, S1, S2, S3), is (1, 0, 1, 1). Therefore, the corresponding data bit D0 is inverted to be output. As a result, by confirming that the read data bits, D0, D1, D2 and D4 are (0, 0, 1, 1), the multifunctional test for correcting data bit D0 can be carried out.

In this manner, according to Embodiment 4, the multifunctional test can be carried out in the ECC circuit 25 by providing the means for setting error correcting code bits so as to generate a syndrome including a bit to be correspondingly corrected. Thus, the reliability of the ECC circuit-containing semiconductor memory device can be improved.

Furthermore, in order to test the error correcting code storage area 9b, the test mode write operation is carried out with all the data bits D0, D1, D2 and D3 set to "1". Even when there is no bit error, the resultant syndrome is not (0, 0, 0, 0) but (1, 1, 1, 1). This syndrome, (1, 1, 1, 1), is characterized by the following two points:

1. There is no bit to be correspondingly corrected; and

2. When an error correcting code includes a 1-bit error, one bit of the syndrome is inverted so that the corresponding data bit can be always corrected. Accordingly, in the case where there is no bit error in the normal read operation, a data the same as a written data can be read.

When the error correcting code, (C0, C1, C2, C3), includes a 1-bit error, however, the resultant syndrome, (S0, S1, S2, S3), is any of the following:

(1, 0, 1, 1) obtained in the case where bit C1 is an error;

(1, 1, 0, 1) obtained in the case where bit C2 is an error;

(1, 1, 1, 0) obtained in the case where bit C3 is an error; and (0, 1, 1, 1) obtained in the case where bit C0 is an error. Therefore, in the normal read operation, bit D0, D1, D2 or D3 is inverted to be output. In this manner, a defect of one bit of the error correcting code is detected, and thus, the error correcting code storage area can be tested.

Table 1 lists all possible defective patterns of the error correcting code storage area and test patterns used for detecting the respective defective patterns in the test mode write operation.

In this manner, according to Embodiment 4, the error correcting code storage area 9a of the memory cell array 5 can be tested by providing the means for setting error correcting code bits so as to generate a syndrome having no correspondingly corrected bits. Thus, the reliability of the ECC circuit-containing semiconductor memory device can be improved.

TABLE 1

TABLE 1-continued

What is claimed is:

1. An ECC circuit-containing semiconductor memory device comprising:

error correcting code generation means including a circuit having a function to generate an error correcting code consisting of plural bits on the basis of a data consisting of plural bits;

data storage means for storing said plural bits of said data;

error correcting code storage means for storing said plural bits of said error correcting code; and decoding means including a circuit having a function to generate a syndrome for error correction by calculation processing on the basis of said data stored in said data storage means and said error correcting code stored in said error correcting code storage means, and a circuit having a function to correct an error of each bit of said data, wherein the functions of said error correcting code generation means and said decoding means are carried out by a shared circuit such that said shared circuit generates said error correcting code and said syndrome, said error correcting code generation means has a function to generate, in a test mode, a memory testing error correcting code such that a data row of said memory testing error correcting code has the same repeat pattern of a data row of said data on the basis of said data, and said pattern includes, as arbitrary two bits, four types of patterns: (0 0) (0 1), (1 0) and (1 1).

2. The ECC circuit-containing semiconductor memory device of claim 1, wherein said repeat pattern of said data row is a checker pattern.

3. An ECC circuit-containing semiconductor memory device comprising:

error correcting code generation means for generating an error correcting code consisting of plural bits on the basis of a data consisting of plural bits;

data storage means for storing said plural bits of said data;

error correcting code storage means for storing said plural bits of said error correcting code;

decoding means having a function to correct an error of each bit of said data by calculating a syndrome for error correction on the basis of said data stored in said data storage means and said error correcting code stored in said error correcting code storage means; and data input control means for arbitrarily change, in a test mode, a value of each bit of said data supplied to said error correcting code generation means, wherein said decoding means has a function to generate an arbitrary testing syndrome in the test mode.

4. An ECC circuit-containing semiconductor memory device comprising:

error correcting code generation means including a circuit having a function to generate an error correcting code consisting of plural bits on the basis of a data consisting of plural bits;

data storage means for storing said plural bits of said data;

error correcting code storage means for storing said plural bits of said error correcting code;

decoding means including a circuit having a function to generate a syndrome for error correction by calculation processing on the basis of said data stored in said data storage means and said error correcting code stored in said error correcting code storage means, and a circuit having a function to correct an error of each bit of said data; and data input control means for changing, in a test mode, a value of each bit of said data supplied to said error correcting code generation means, into a value different from said value of each bit of said data, wherein the functions of said error correcting code generation means and said decoding means are carried out by a shared circuit such that said shared circuit generates said error correcting code and said syndrome, and said decoding means has a function to generate, in the test mode, a syndrome in such a pattern that no data bit is to be correspondingly corrected but any data bit is to be correspondingly corrected when any bit of said syndrome is inverted.

5. A method of testing an ECC circuit-containing semiconductor memory device including error correcting code generation means including a circuit having a function to generate an error correcting code consisting of plural bits on the basis of a data consisting of plural bits, data storage means for storing said plural bits of said data, error correcting code storage means for storing said plural bits of said error correcting code, and decoding means including a circuit having a function to generate a syndrome for error correction by calculation processing on the basis of said data stored in said data storage means and said error correcting code stored in said error correcting code storage means, and a circuit having a function to correct an error of each bit of said data, said error correcting code generation means sharing a circuit with said decoding means, and said shared circuit having a function to generate said error correcting code and said syndrome, wherein the functions of said error correcting code generation means and said decoding means are carried out by a shared circuit such that said shared circuit generates said error correcting code and said syndrome, comprising the step of:

generating a memory testing data and a memory testing error correcting code in a pattern of the same type as a pattern of said memory testing data, including, as arbitrary two bits, four types of patterns in said patterns: (0 0), (0 1), (1 0) and (1 1), and writing said memory testing data in said data storage means and said memory testing error correcting code in said error correcting code storage means for testing said data storage means and said error correcting code storage means.

6. The method of testing an ECC circuit-containing memory device of claim 5, wherein a data row of said memory testing error correcting code has the same repeat pattern as a data row of said memory testing data.

7. The method of testing an ECC circuit-containing memory device of claim 6, wherein said repeat pattern of said data row is a checker pattern.

8. A method of testing an ECC circuit-containing semiconductor memory device including error correcting code generation means for generating an error correcting code consisting of plural bits on the basis of a data consisting of plural bits, data storage means for storing said plural bits of said data, error correcting code storage means for storing said plural bits of said error correcting code, and decoding means having a function to correct an error of each bit of said data by calculating a syndrome for error correction on the basis of said data stored in said data storage means and said error correcting code stored in said error correcting code storage means, comprising the step of:

generating a memory testing data and a memory testing error correcting code each including, as arbitrary two bits, four types of patterns: (0 0), (0 1), (1 0) and (1 1).

9. A method of testing an ECC circuit-containing semiconductor memory device including error correcting code generation means for generating an error correcting code consisting of plural bits on the basis of a data consisting of plural bits, data storage means for storing said plural bits of said data, error correcting code storage means for storing said plural bits of said error correcting code, and decoding means having a function to correct an error of each bit of said data by calculating a syndrome for error correction on the basis of said data stored in said data storage means and said error correcting code stored in said error correcting code storage means, comprising the step of:

generating an arbitrary testing syndrome by generating, from said data, a testing error correcting code in a pattern different from a pattern of said error correcting code.

* * * * *